(12) United States Patent
Chan et al.

(10) Patent No.: US 9,349,830 B2
(45) Date of Patent: May 24, 2016

(54) SEMICONDUCTOR ELEMENT AND MANUFACTURING METHOD AND OPERATING METHOD OF THE SAME

(71) Applicant: MACRONIX INTERNATIONAL CO., LTD., Hsinchu (TW)

(72) Inventors: Wing-Chor Chan, Hsinchu (TW); Hsin-Liang Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 204 days.

(21) Appl. No.: 13/784,886

(22) Filed: Mar. 5, 2013

(65) Prior Publication Data

US 2014/0253224 A1 Sep. 11, 2014

(51) Int. Cl.
| | |
|---|---|
| *H01L 29/00* | (2006.01) |
| *H01L 29/66* | (2006.01) |
| *H01L 29/78* | (2006.01) |
| *H01L 29/06* | (2006.01) |
| *H01L 29/74* | (2006.01) |
| *H01L 29/749* | (2006.01) |
| *H01L 29/861* | (2006.01) |
| *H01L 27/02* | (2006.01) |
| *H01L 29/423* | (2006.01) |
| *H01L 29/08* | (2006.01) |

(52) U.S. Cl.
CPC ...... *H01L 29/66477* (2013.01); *H01L 29/0696* (2013.01); *H01L 29/749* (2013.01); *H01L 29/7436* (2013.01); *H01L 29/7816* (2013.01); *H01L 29/7821* (2013.01); *H01L 29/7835* (2013.01); *H01L 27/027* (2013.01); *H01L 29/0878* (2013.01); *H01L 29/42368* (2013.01); *H01L 29/861* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,035,229 | B2 * | 10/2011 | Yabu | H01L 27/0207 257/382 |
| 2006/0068538 | A1 * | 3/2006 | Ogura | H01L 21/823418 438/197 |
| 2009/0315113 | A1 * | 12/2009 | Vashchenko | H01L 27/0262 257/355 |

* cited by examiner

*Primary Examiner* — Ali Naraghi
(74) *Attorney, Agent, or Firm* — McClure, Qualey & Rodack, LLP

(57) ABSTRACT

A semiconductor element and a manufacturing method and an operating method of the same are provided. The semiconductor element includes a substrate, a first well, a first heavily doping region, at least a second heavily doping region, a gate layer, a third heavily doping region, and a fourth heavily doping region. The first well and the third heavily doping region are disposed on the substrate. The first and fourth heavily doping regions are disposed in the first well. The second heavily doping region is disposed in the first heavily doping region. The gate layer is disposed on the first well. The first, third, and fourth heavily doping regions having a first type doping are separated from one another. The first well and the second heavily doping region have a second type doping complementary to the first type doping.

12 Claims, 9 Drawing Sheets

SEMICONDUCTOR ELEMENT AND MANUFACTURING METHOD AND OPERATING METHOD OF THE SAME

BACKGROUND

1. Technical Field

The disclosure relates in general to a semiconductor element, a manufacturing method thereof and an operating method thereof, and particularly to a semiconductor element, a manufacturing method thereof and an operating method thereof used for electrostatic discharge (ESD) protection.

2. Description of the Related Art

Extended drain MOSFET (EDMOSFET), lateral double-diffused MOSFET (LDMOSFET), and reduced surface field (RESURF) technology are used as high-voltage elements for manufacturing output drivers due to the compatibility with existing CMOS processes. The electrostatic discharge (ESD) performance of typical high-voltage devices often depends on the total width and surface or lateral rules of the corresponding devices.

High-voltage devices typically have characteristics that include a low on-state resistance (Rdson), a high breakdown voltage and a low holding voltage. The low on-state resistance may tend to make an ESD current more likely to concentrate on the surface or the drain edge of a device during an ESD event. High current and high electric fields may cause the physical destruction at a surface junction region of such a device. Based on the typical requirement for a low on-state resistance, the surface or lateral rules likely cannot be increased. Thus, ESD protection may be a challenge.

The high breakdown voltage characteristic of high-voltage devices typically means that the breakdown voltage is higher than the operating voltage, and the trigger voltage (Vt1) is higher than the breakdown voltage. Accordingly, during an ESD event, the internal circuitry of the high-voltage device may be at risk of damage before the high-voltage device turns on for ESD protection. The low holding voltage characteristic of high-voltage devices also leaves open the possibility that unwanted noise associated with a power-on peak voltage or a surge voltage may be triggered or that a latch-up may occur during normal operation. High-voltage devices may also experience the field plate effect due to the fact that electric field distribution may be sensitive to routing so that ESD current may be likely to concentrate at the surface or drain edge during an ESD event.

To improve high-voltage device performance with respect to ESD events, one technique that has been implemented involves the additional use of masks and other processes to create a larger sized diode within bipolar junction transistor (BJT) components and/or increasing the surface or lateral rules for MOS transistors.

Accordingly, it may be desirable to develop an improved structure for providing ESD resistance.

SUMMARY

The disclosure relates in general to a semiconductor element, a manufacturing method thereof and an operating method thereof. In the semiconductor element, a diode col-locating with an existing metal oxide semiconductor (MOS) provides an excellent ESD protection.

According to an embodiment of the disclosure, a semiconductor element is provided. The semiconductor element includes a substrate, a first well, a first heavily doping region, at least a second heavily doping region, a gate layer, a third heavily doping region, and a fourth heavily doping region. The first well is disposed on the substrate. The first heavily doping region is disposed in the first well. The second heavily doping region is disposed in the first heavily doping region. The gate layer is disposed on the first well. The third heavily doping region is disposed on the substrate. The fourth heavily doping region is disposed in the first well. The first heavily doping region, the third heavily doping region, and the fourth heavily doping regions having a first type doping are separated from one another. The first well and the second heavily doping region have a second type doping complementary to the first type doping.

According to another embodiment of the disclosure, a manufacturing method of a semiconductor element is provided. The manufacturing method of the semiconductor element includes the following steps. A substrate is provided. A first well is formed on the substrate. A first heavily doping region is formed in the first well. At least a second heavily doping region is formed in the first heavily doping region. A gate layer is formed on the first well. A third heavily doping region is formed on the substrate. A fourth heavily doping region is formed in the first well. The first heavily doping region, the third heavily doping region, and the fourth heavily doping regions having a first type doping are separated from one another, and the first well and the second heavily doping region have a second type doping complementary to the first type doping.

According to a further embodiment of the disclosure, an operating method of a semiconductor element is provided. The operating method of the semiconductor element includes the following steps. A semiconductor element is provided, wherein the semiconductor element includes a substrate, a first well, a first heavily doping region, at least a second heavily doping region, a gate layer, a third heavily doping region, and a fourth heavily doping region; and a gate voltage is applied to the gate layer and the fourth heavily doping region. The first well is disposed on the substrate. The first heavily doping region is disposed in the first well. The second heavily doping region is disposed in the first heavily doping region. The gate layer is disposed on the first well. The third heavily doping region is disposed on the substrate. The fourth heavily doping region is disposed in the first well. The first heavily doping region, the third heavily doping region, and the fourth heavily doping regions having a first type doping are separated from one another. The first well and the second heavily doping region have a second type doping complementary to the first type doping. When the gate voltage is higher than a reverse bias, a diode formed from the heavily doping region and the first well is electrically conductive. When the gate voltage is lower than the reverse bias, a metal oxide semiconductor (MOS) formed from the first heavily doping region, the third heavily doping region, and the gate layer is electrically conductive.

The above and other aspects of the disclosure will become better understood with regard to the following detailed description of the non-limiting embodiment(s). The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

First Embodiment

Figure 1:
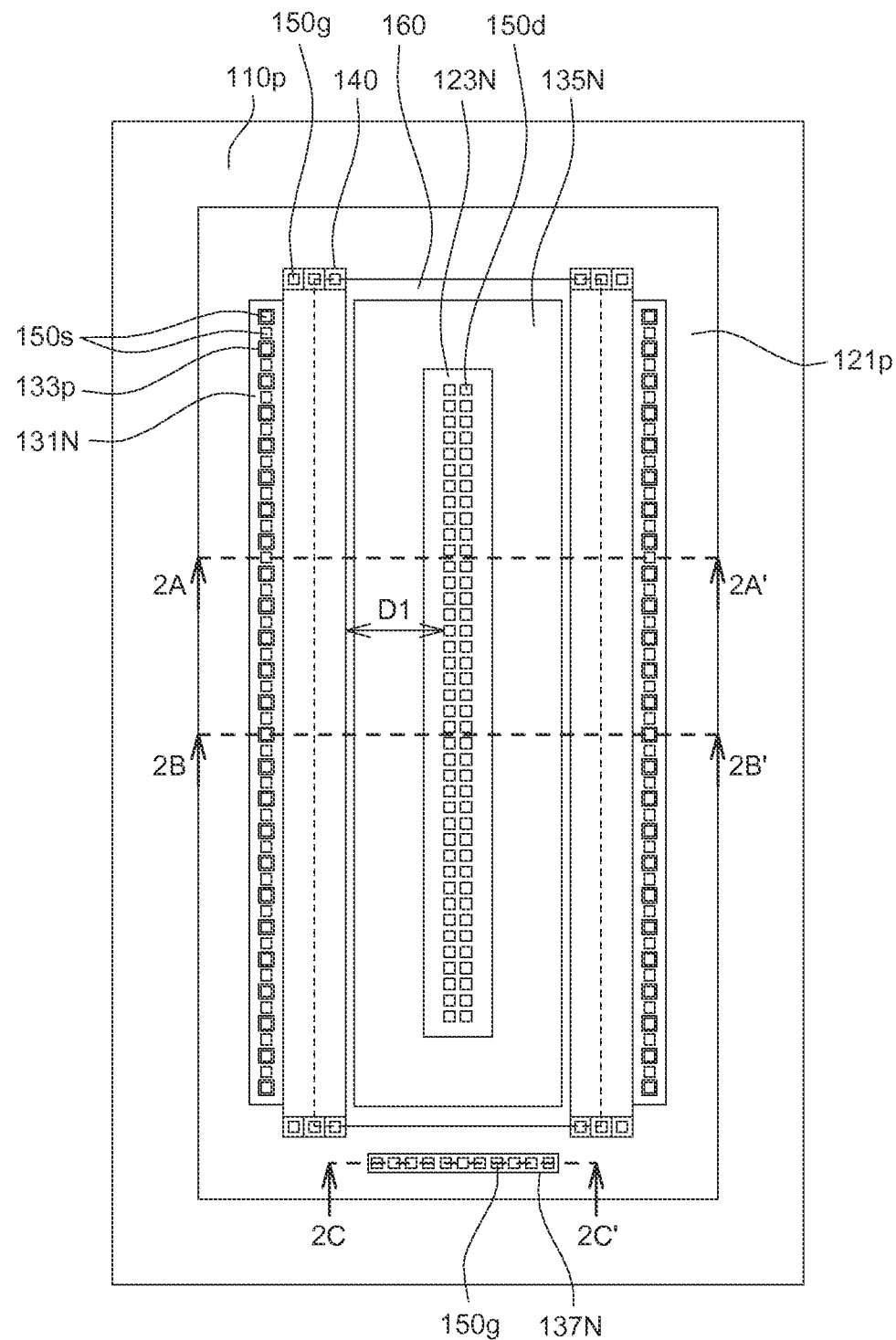
FIG. 1 shows a top view of a semiconductor element according to the first embodiment of the present disclosure.
Figure 2A:
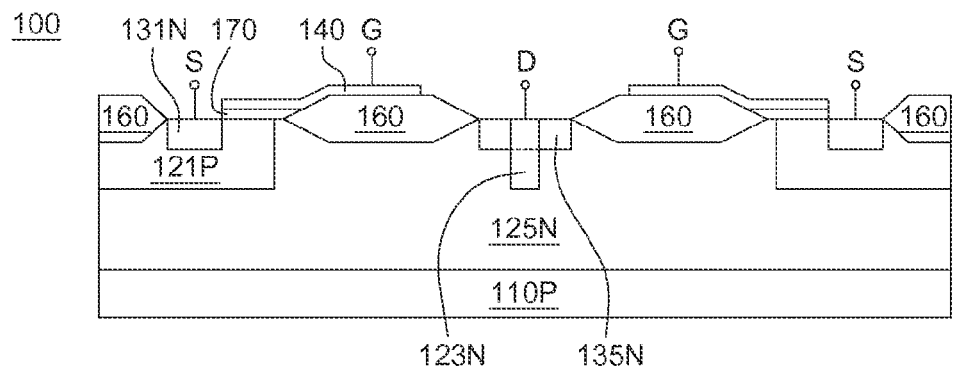
FIG. 2A shows a cross-sectional view along the section line 2A-2A' in FIG. 1.
Figure 2B:
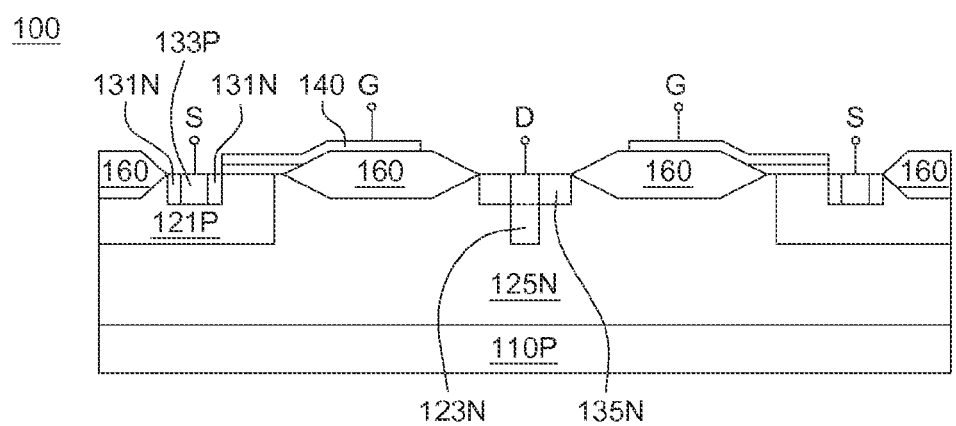
FIG. 2B shows a cross-sectional view along the section line 2B-2B' in FIG. 1.
Figure 2C:
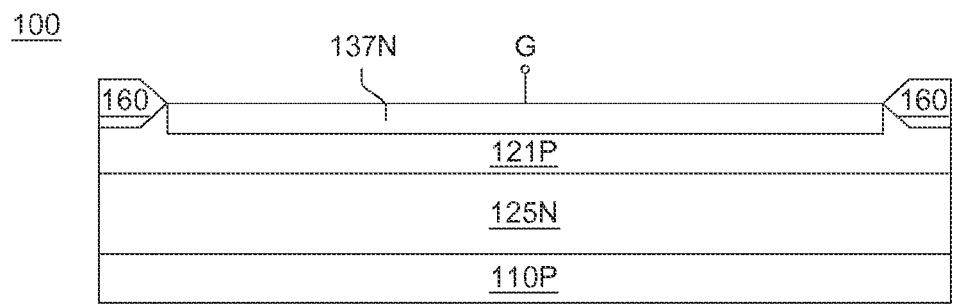
FIG. 2C shows a cross-sectional view along the section line 2C-2C' in FIG. 1.

FIG. 1 shows a top view of a semiconductor element according to the first embodiment of the present disclosure, FIG. 2A shows a cross-sectional view along the section line 2A-2A' in FIG. 1, FIG. 2B shows a cross-sectional view along the section line 2B-2B' in FIG. 1, and FIG. 2C shows a cross-sectional view along the section line 2C-2C' in FIG. 1.

Referring to FIGS. 1 and 2A-2C, a semiconductor element 100 includes a substrate 110P, a first well 121P, a first heavily doping region 131N, at least a second heavily doping region 133P, a gate layer 140, a third heavily doping region 135N, and a fourth heavily doping region 137N. The first well 121P is disposed on the substrate 110P. The first heavily doping region 131N is disposed in the first well 121P. The second heavily doping region 133P is disposed in the first heavily doping region 133N. The gate layer 140 is disposed on the first well 121P. The third heavily doping region 135N is disposed on the substrate 110P. The fourth heavily doping region 137N is disposed in the first well 121P. The first heavily doping region 131N, the third heavily doping region 135N, and the fourth heavily doping region 137N having a first type doping are separated from one another. The first well 121P and the second heavily doping region 133P have a second type doping, which is complementary to the first type doping.

In the embodiment, the material of the substrate 110P may be P type silicon or N type silicon. The material of the gate layer 140 and the fourth heavily doping region 137N may be polysilicon. The first type doping may be P type doping or N type doping, and the second type doping may be the other one different from the first type doping.

In the embodiment, the first heavily doping region 131N, the third heavily doping region 135N, and the fourth heavily doping region 137N may be N type heavily doping regions (N+), the first well 121P may be a P type well, and the second heavily doping region 133P may be a P type heavily doping region (P+). The doping concentrations of the first heavily doping region 131N, the second heavily doping region 133P, the third heavily doping region 135N, and the fourth heavily doping region 137N are higher than that of the first well 121P.

In the embodiment, as shown in FIG. 1, the second heavily doping region 133P is disposed in the first heavily doping region 131N, of which both are electrically connected to a source terminal S. As such, the area of the source terminal S is reduced. In addition, the whole periphery of the second heavily doping region 133P is adjacent to the first heavily doping region 131N, such that a plurality of equivalent bipolar junction transistors (BJT) can be formed, providing an improved ESD protection.

As shown in FIG. 1, the semiconductor element 100 may further comprise a plurality of contacts 150s electrically connecting the first heavily doping region 131N and the second heavily doping region 133P to the source terminal S. In the embodiment, as shown in FIG. 1, the semiconductor element 100 comprises a plurality of second heavily doping regions 133P in the first heavily doping region 133P, and the contacts 150s are electrically connected to the second heavily doping regions 133P and the first heavily doping region 131N between the second heavily doping regions 133P interlacedly. In the embodiment, the ratio of the amount of the contacts 150s electrically connected to the first heavily doping region 131N to that electrically connected to the second heavily doping regions 133P is about 1:1. The material of the contacts 150s may be tungsten.

In the embodiment, as shown in FIG. 1, the whole periphery of each contact 150s is located in the corresponding second heavily doing region 133P. The size of the contacts 150s is smaller than that of the second heavily doping regions 133P, accordingly, misalignments in the subsequent processes can be prevented.

In the embodiment, as shown in FIGS. 1 and 2A-2C, the gate layer 140 and the fourth heavily doping region 137N are electrically connected to a gate terminal G through contacts 150g, and the third heavily doping region 135N is electrically connected to a drain terminal D through contacts 150d. In the embodiment, the distance D1 between the contacts 150d and the gate layer 140 is about 3.5 µm.

In the embodiment, as shown in FIG. 2C, the fourth heavily doping region 137N is disposed in the first well 121P and forms a junction with the first well 121P. The fourth heavily doping region 137N and the first well 121P form a clamp diode.

As shown in FIGS. 1 and 2A-2B, in one embodiment, the semiconductor element 100 may further comprise a second well 123N disposed in the third heavily doping region 135N extending toward the substrate 110P. The doping concentration of the third heavily doping region 135N is higher than that of the second well 123N. In the embodiment, the second well 123N has the first type doping and may be a N type well. The second well 123N can change the current effect, causing the ESD current flowing out more easily, and a breakdown voltage may also be lowered.

As shown in FIGS. 1 and 2A-2C, in one embodiment, the semiconductor element 100 may further comprise a third well 125N disposed between the substrate 110P and the third heavily doping region 135N. In the embodiment, the third well 125N has the first type doping and may be a deep N type well. The second well 123N extends into the third well 125N. The doping concentrations of the first heavily doping regions 131N, the second heavily doping region 133P, the third heavily doping region 135N, and the fourth heavily doping region 137N is higher than the doping concentrations of the second well 123N and the third well 125N.

In the embodiment, the semiconductor element 100 may further comprise a field oxide layer 160 disposed between the first well 121P and the third heavily doping region 135N. The material of the field oxide layer 160 may be silicon oxide ($SiO_2$). In the embodiment, as shown in FIGS. 2A-2B, the gate layer 140 is partially disposed on one of the field oxide layers 160. In the embodiment, the semiconductor element 100 may further comprise a gate oxide layer 170 disposed between the gate layer 140 and the third well 125N and adjacent to the junction between the first well 121P and the third well 125N.

Second Embodiment

Figure 3:
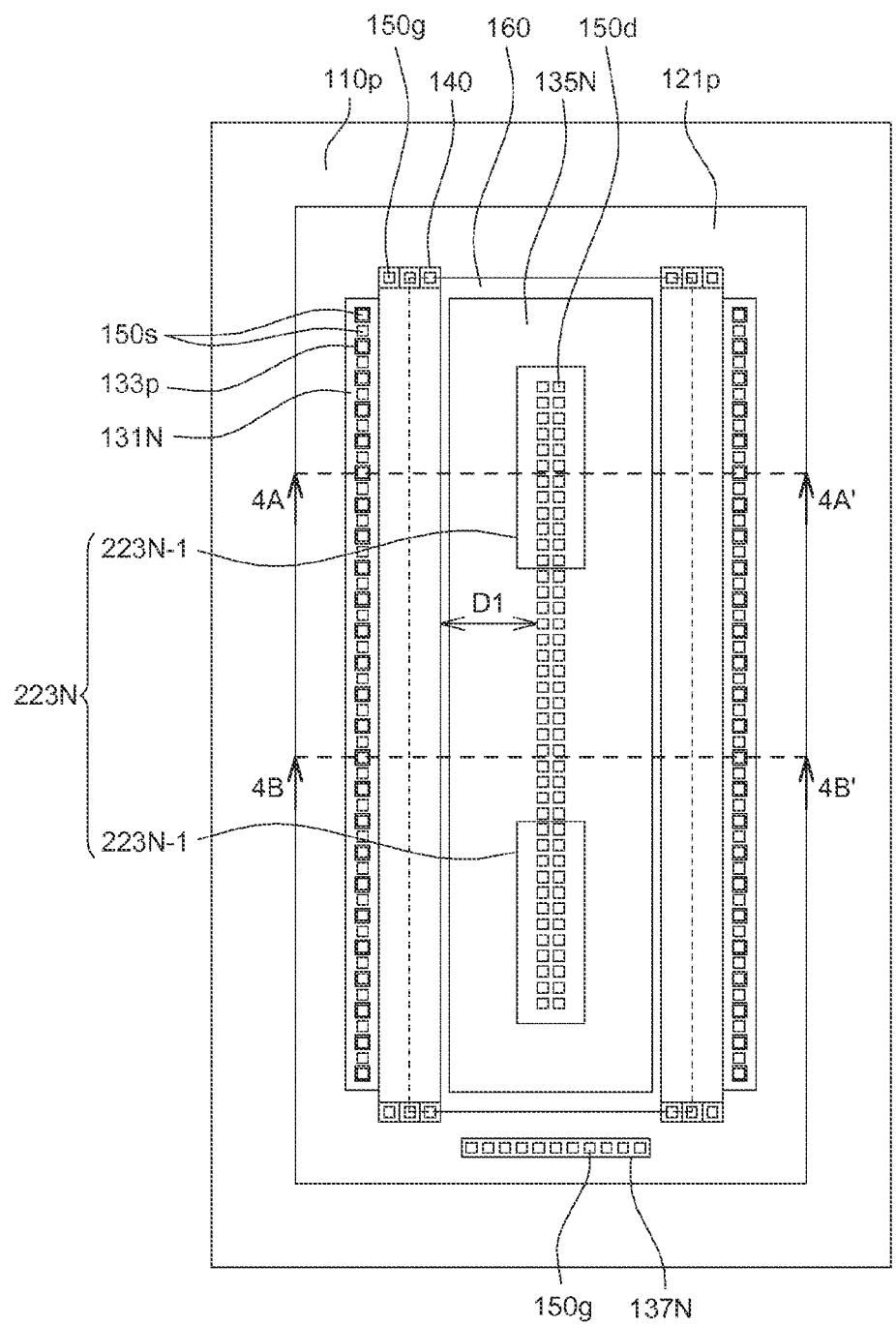
FIG. 3 shows a top view of a semiconductor element according to the second embodiment of the present disclosure.
Figure 4A:
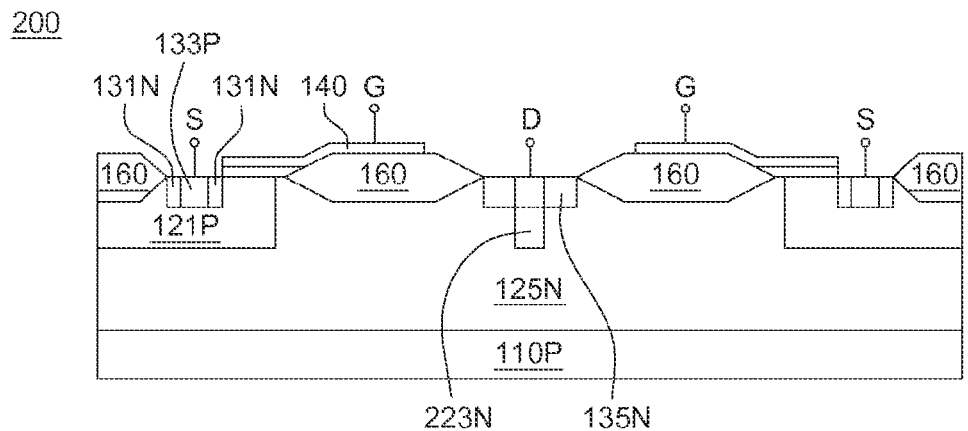
FIG. 4A shows a cross-sectional view along the section line 4A-4A' in FIG. 3.
Figure 4B:
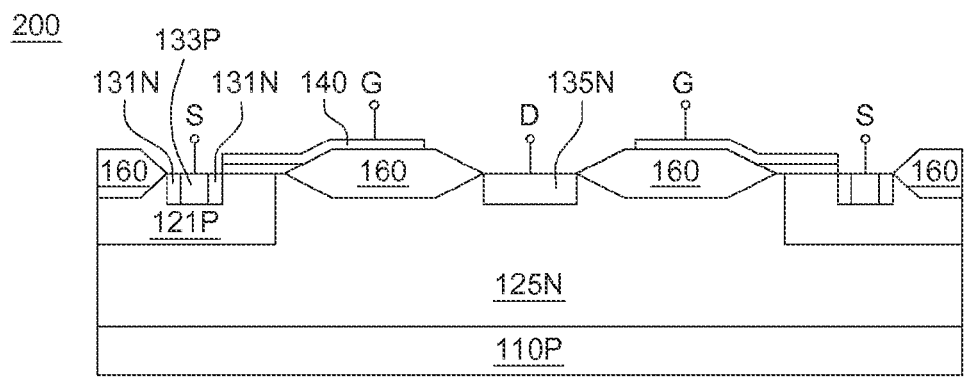
FIG. 4B shows a cross-sectional view along the section line 4B-4B' in FIG. 1.

FIG. 3 shows a top view of a semiconductor element according to the second embodiment of the present disclosure, FIG. 4A shows a cross-sectional view along the section line 4A-4A' in FIG. 3, and FIG. 4B shows a cross-sectional view along the section line 4B-4B' in FIG. 1. The semiconductor element 200 of the present embodiment is different from the semiconductor element 100 of the first embodiment in the design of the second well 223N, and the similarities are not repeated here.

As shown in FIGS. 2 and 4A-4B, in the semiconductor element 200, the second well 223N comprises a first region 223N-1 and a second region 223N-2, which are separated from each other. In the embodiment, as shown in FIG. 3, the first region 223N-1 and the second region 223N-2 are separated from each other and expose a middle portion of the surface of the third heavily doping region 135N.

Normally, ESD tends to occur from the middle portion of a surface of a device. In the embodiment, the middle portion of the surface of the third heavily doping region 135N is exposed from the first region 223N-1 and the second region 223N-2, separated from each other, of the second well 223N. The resistance of the second well 223N is lower than that of the third heavily doping region 135N, as such, the second well 223N is electrically conducted more easily. Accordingly, the ESD current occurred in the middle portion of the surface of the device flows to the first region 223N-1 and the second region 223N-2 located on two sides, and hence the effect of ESD protection is increased.

Third Embodiment

Figure 5A:
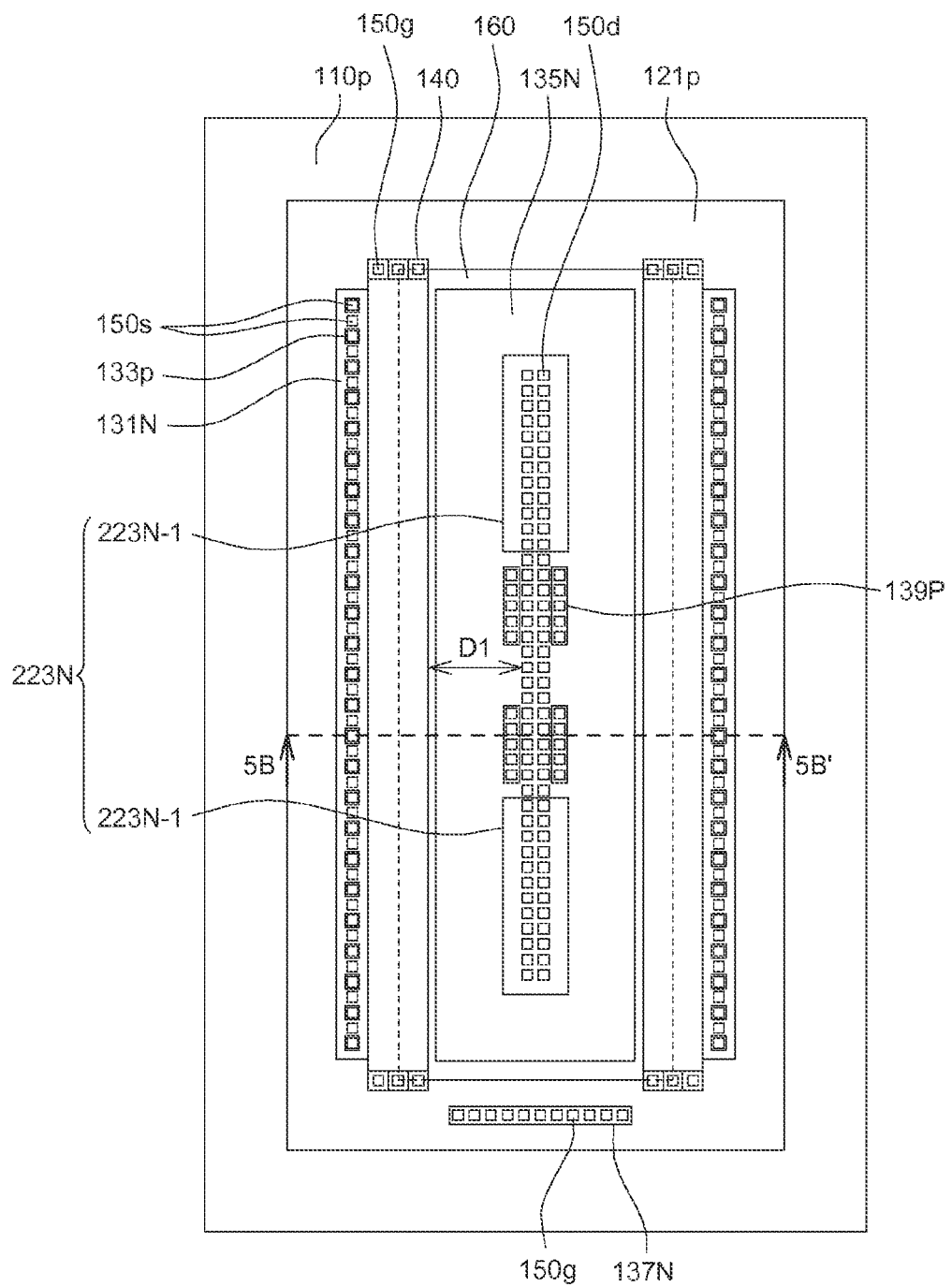
FIG. 5A shows a top view of a semiconductor element according to the third embodiment of the present disclosure.
Figure 5B:
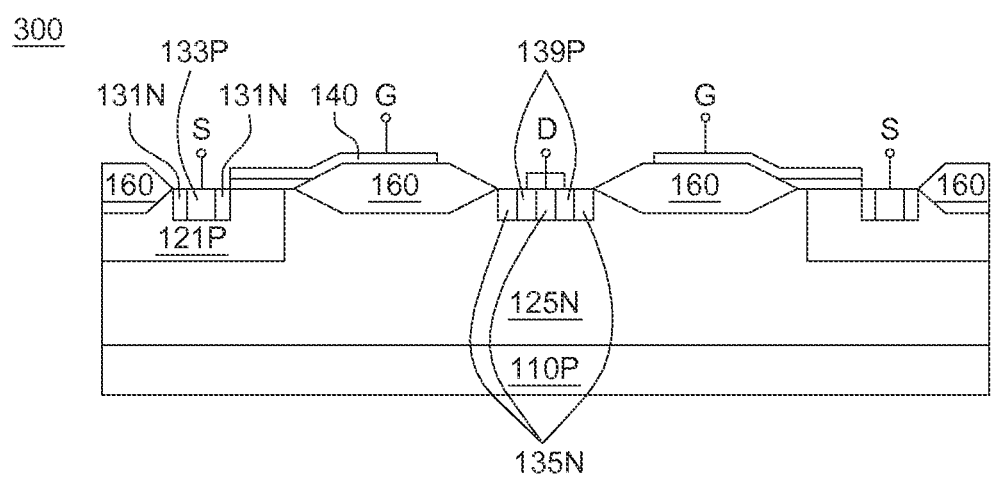
FIG. 5B shows a cross-sectional view along the section line 5B-5B' in FIG. 5A.

FIG. 5A shows a top view of a semiconductor element according to the third embodiment of the present disclosure, and FIG. 5B shows a cross-sectional view along the section line 5B-5B' in FIG. 5A. The semiconductor element 300 of the present embodiment is different from the semiconductor element 200 of the second embodiment in the design of a fifth heavily doping region 139P, and the similarities are not repeated here.

As shown in FIGS. 5A-5B, the semiconductor element 300 may further comprise the fifth heavily doping region 139P disposed in the third heavily doping region 135N and located between the first region 223N-1 and the second region 223N-2. The fifth heavily doping region 139P has the second type doping and may be a P type heavily doping region. As such, a silicon control rectifier (SCR) may be generated, improving ESD protection.

In the embodiment, as shown in FIG. 5A, the semiconductor element 300 comprises, for example, four fifth heavily doping regions 139P located on two sides of the contacts 150$d$ between the first region 223N-2 and the second region 223N-2. The third heavily doping region 135N and the fifth heavily doping regions 139P are electrically connected to the drain terminal D through contacts 150$d$.

Fourth Embodiment

Figure 6A:
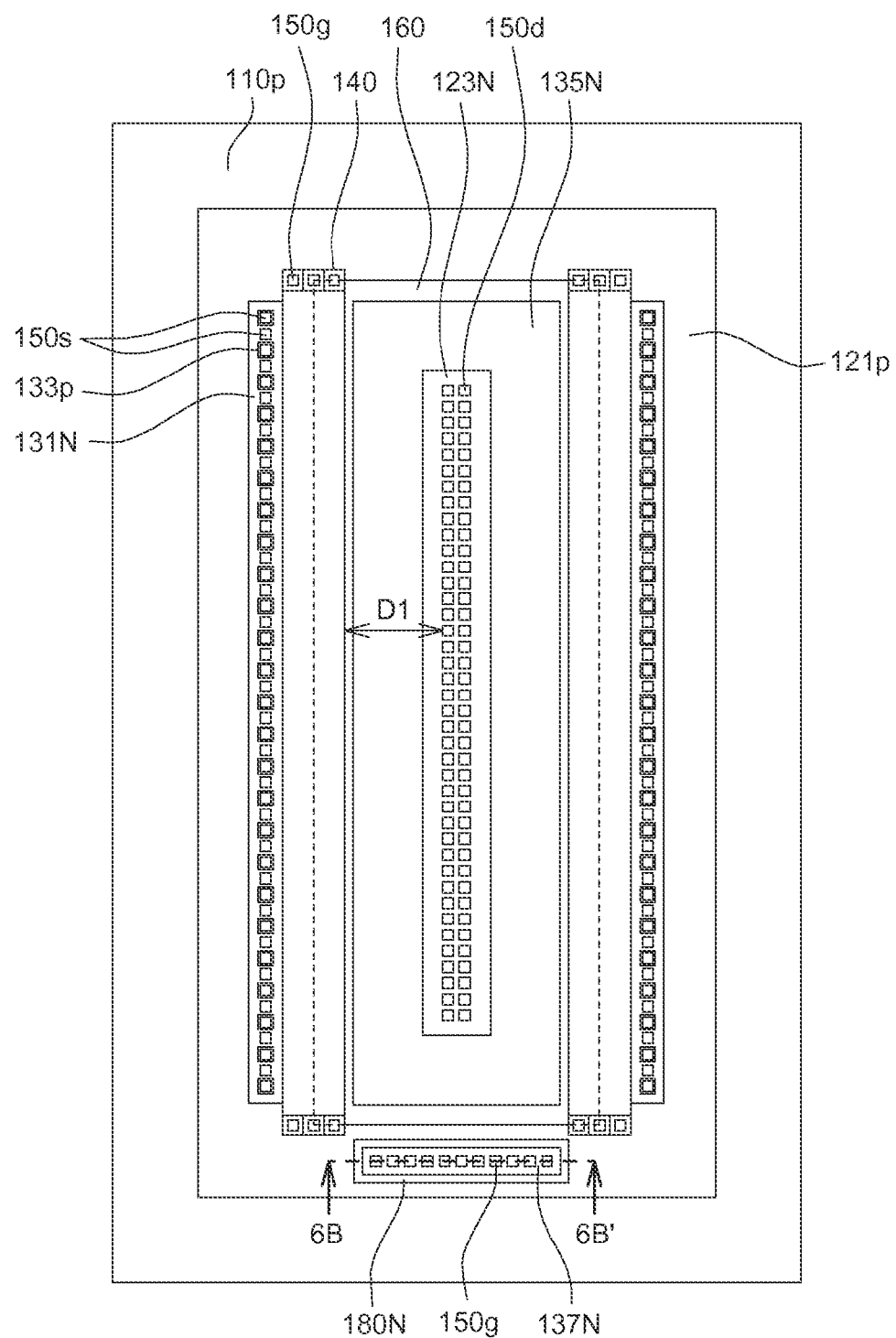
FIG. 6A shows a top view of a semiconductor element according to the fourth embodiment of the present disclosure.
Figure 6B:
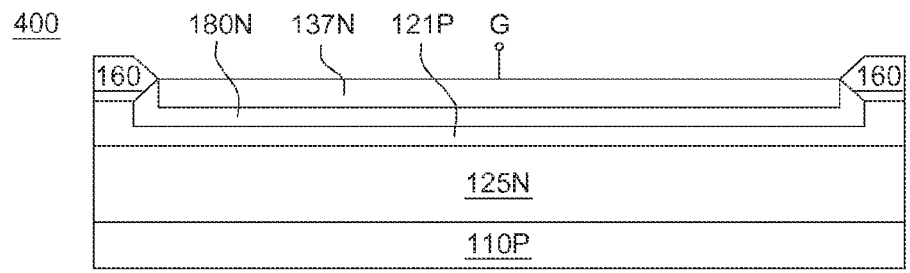
FIG. 6B shows a cross-sectional view along the section line 6B-6B' in FIG. 6A.

FIG. 6A shows a top view of a semiconductor element according to the fourth embodiment of the present disclosure, and FIG. 6B shows a cross-sectional view along the section line 6B-6B' in FIG. 6A. The semiconductor element 400 of the present embodiment is different from the semiconductor element 100 of the first embodiment in the design of a first lightly doping region 180N, and the similarities are not repeated here.

As shown in FIG. 6A, the semiconductor element 400 may further comprise the first lightly doping region 180N disposed between the first well 121P and the fourth heavily doping region 137N. The first lightly doping region 180N has the first type doping and may be a N type lightly doping region. In the embodiment, the first lightly doping region 180N fully covers the fourth heavily doping region 137N and totally separates the first well 121 from the fourth heavily doping region 137N. As such, the breakdown voltage of the whole semiconductor element can be increased to about 15-30 V.

Fifth Embodiment

Figure 7:
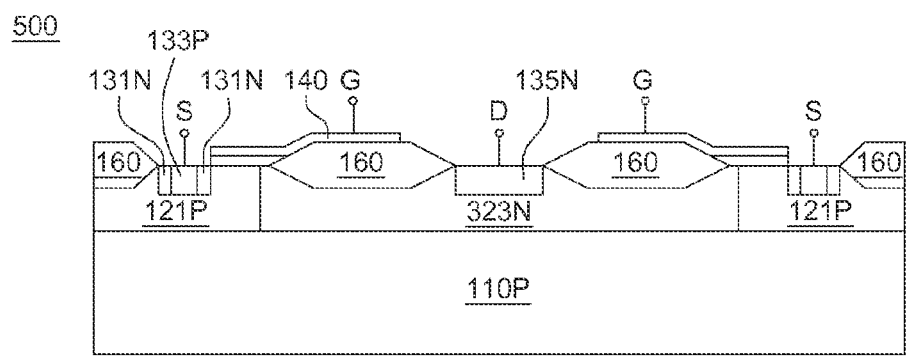
FIG. 7 shows a cross-sectional view of a semiconductor element according to the fifth embodiment of the present disclosure.

FIG. 7 shows a cross-sectional view of a semiconductor element according to the fifth embodiment of the present disclosure. The semiconductor element 500 of the present embodiment is different from the semiconductor element 100 of the first embodiment in the design of the second well 323N, and the similarities are not repeated here.

As shown in FIG. 7, in the semiconductor element 500, the second well 323N is disposed on the substrate 110P, and the third heavily doping region 135N is disposed in the second well 323N. The second well 323N has the first type doping and may be a N type well. In the embodiment, the first well 121P is adjacent to the substrate 110P and the second well 323N.

Sixth Embodiment

Figure 8:
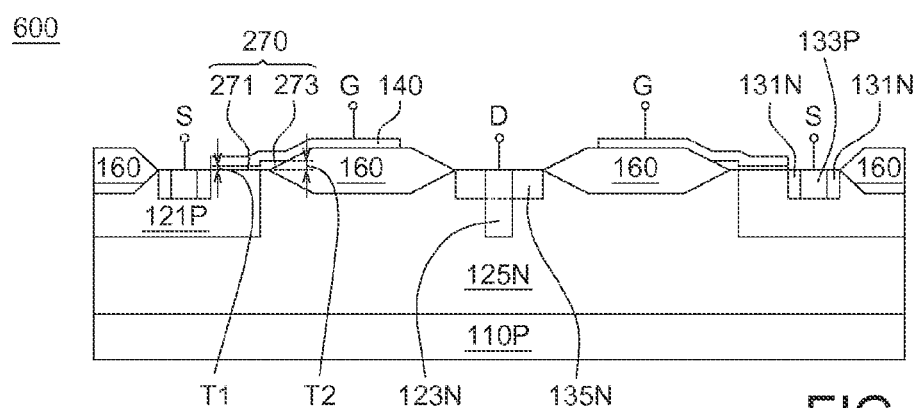
FIG. 8 shows a cross-sectional view of a semiconductor element according to the sixth embodiment of the present disclosure.

FIG. 8 shows a cross-sectional view of a semiconductor element according to the fifth embodiment of the present disclosure. The semiconductor element 600 of the present embodiment is different from the semiconductor element 100 of the first embodiment in the design of the gate oxide layer 270, and the similarities are not repeated here.

As shown in FIG. 8, the gate oxide layer 270 comprises a first gate oxide segment 271 and a second gate oxide segment 273. The gate oxide layer 270 is disposed between the gate layer 140 and the third well 125N and located adjacent to the junction between the first well 121P and the third well 125N. The first gate oxide segment 271 is disposed between the gate layer 140 and the first well 121P, and the second gate oxide segment 273 is disposed between the first gate oxide segment 271 and the field oxide layer 160. The thickness T1 of the first gate oxide segment 271 is smaller than the thickness T2 of the second gate oxide segment 273.

In the embodiment, the thickness T1 of the first gate oxide segment 271 is such as 0.008~0.02 µm, and the thickness T2 of the second gate oxide segment 273 is such as 0.025~0.09 µm. As such, the voltage withstanding ability of the whole element can be increased, and the breakdown voltage of the semiconductor element can be largely increased by about 10 V.

At least one of the P type wells aforementioned can be replaced by a P type body implantation for forming a LDMOS. The deep N type well aforementioned can be replaced by a N type well or a N type well having a N type buried layer (NBL).

Figure 9:
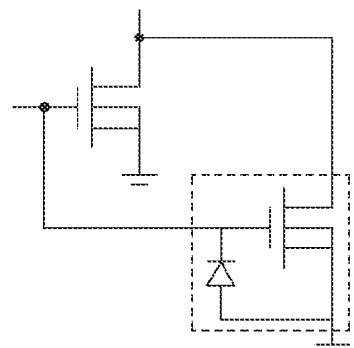
FIG. 9 illustrates a circuit of a semiconductor element according to an embodiment of the present disclosure.

FIG. 9 illustrates a circuit of a semiconductor element according to an embodiment of the present disclosure. As shown in FIG. 9, the portion circled with dashed lines represents the circuit of the semiconductor element according to the embodiments of the present disclosure. In the circuit, a diode is formed from the fourth heavily doping region 137N and the first well 121P, and a metal oxide semiconductor (MOS) is formed from the first heavily doping region 131N, the third heavily doping region 135N, and the gate layer 140. While the diode is applied with a forward biased voltage, there is an impedance which is at least 0.7 V. While the diode is applied with a reverse biased voltage, there is an impedance which is at least 12-20 V.

In the embodiment, an operating method of the semiconductor element includes the following steps. A semiconductor element as aforementioned in the previous embodiments is provided, and a gate voltage is applied to the gate layer 140 and the fourth heavily doping region 137N. When the gate voltage is higher than a reverse bias, the diode is electrically conductive, and when the gate voltage is lower than the reverse bias, the MOS is electrically conductive. The reverse bias is such as about 12V, such that the gate oxide layer can be protected from the damage by a high voltage.

Figure 10A:
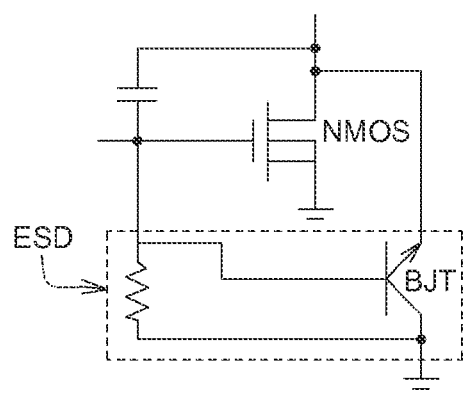
FIG. 10A illustrates an equivalent circuit of a semiconductor element according to an embodiment of the present disclosure.

The semiconductor element according to the embodiments can be used as an ESD protection device. FIG. 10A illustrates an equivalent circuit of a semiconductor element according to an embodiment of the present disclosure, and FIG. 10B illustrates another equivalent circuit of a semiconductor element according to an embodiment of the present disclosure.

As shown in FIG. 10A, the semiconductor element ESD is electrically connected to another metal oxide semiconductor device NMOS. During a positive ESD event in the element, the metal oxide semiconductor device NMOS is such as a large width EDNMOS, a RC coupling occurred between the resistance, which is generated by the clamp diode formed from the fourth heavily doping region 137N and the first well 121P with a reverse bias applied, and the parasitic capacitor, which is generated between a drain and a gate in the large width EDNMOS, such that the metal oxide semiconductor device NMOS is electrically conductive through the gate. Accordingly, the positive ESD current connects ground through the metal oxide semiconductor device NMOS.

In addition, during a positive ESD event, as shown in FIG. 10A, a parasitic NPN bipolar junction transistor BJT is generated as well. The positive ESD current can connect ground through the bipolar junction transistor BJT. Moreover, the trigger voltage of the bipolar junction transistor BJT is lower than the trigger voltage of the large width EDNMOS (e.g. the metal oxide semiconductor device NMOS as shown in FIG. 10A), as a result, the positive ESD current can flow to the bipolar junction transistor BJT before the breakdown voltage of the metal oxide semiconductor device NMOS is reached, and hence an excellent ESD protection is provided to the metal oxide semiconductor device NMOS. In other words, the positive ESD current can connect ground through two approaches. When the positive ESD energy is relatively low, the ESD current may connect ground through the metal oxide semiconductor device NMOS. When the positive ESD energy is relatively high, the ESD current may connect ground through the bipolar junction transistor BJT.

Figure 10B:
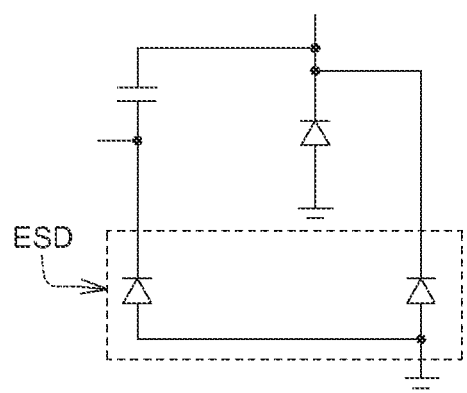
FIG. 10B illustrates another equivalent circuit of a semiconductor element according to an embodiment of the present disclosure.

During a negative ESD event, as shown in FIG. 10B, equivalent diodes are generated from the metal oxide semiconductor device NMOS and the semiconductor element ESD. Diodes can provide excellent protection, therefore, the semiconductor element according to the embodiments of the present disclosure are also provided with an excellent negative ESD protection.

In applications, a semiconductor device may include a plurality of metal oxide semiconductor elements, of which only a few are modified according to the embodiments of the present disclosure, such that the whole device is provided with an excellent ESD protection. Moreover, the selected semiconductor element modified for ESD protection can still pertain the original operating functions. As such, arrangement of additional ESD protection element is not required, and the size of the whole semiconductor device can be properly reduced.

The embodiments disclosed below are for elaborating a manufacturing method of the semiconductor element of the disclosure. However, the descriptions disclosed in the embodiments of the disclosure such as detailed manufacturing procedures are for illustration only, not for limiting the scope of protection of the disclosure. People having ordinary skills in the art may modified or change the steps disclosed in the embodiments according actual needs.

Referring to FIGS. 1 and 2A-2C, in the embodiment, the manufacturing method of the semiconductor element 100 includes such as the following steps. The substrate 110P is provided. The first well 121P is formed on the substrate 110P. The first heavily doping region 131N is formed in the first well 121P. At least one second heavily doping region 133P is formed in the first heavily doping region 133N. The gate layer 140 is formed on the first well 121P. The third heavily doping region 135N is formed on the substrate 110P. The fourth heavily doping region 137N is formed in the first well 121P. The first heavily doping region 131N, the third heavily doping region 135N, and the fourth heavily doping region 137N having the first type doping are separated from one another. The first well 121P and the second heavily doping region 133P have the second type doping, which is complementary to the first type doping.

In one embodiment, as shown in FIGS. 1 and 2A-2C, a plurality of contacts 150s may be further formed for electrically connecting the first heavily doping region 131N and the second heavily doping region 133P to the source terminal S.

In one embodiment, as shown in FIGS. 1 and 2A-2C, the second well 123N may be further formed in the third heavily doping region 135N extending toward the substrate 110P. The second well 123N has the first type doping.

In one embodiment, as shown in FIGS. 1 and 2A-2C, the third well 125N may be further formed between the substrate 110P and the third heavily doping region 135N. The third well 125N has the first type doping. The second well 123N extends into the third well 125N.

In one embodiment, as shown in FIGS. 1 and 2A-2C, the field oxide layer 160 may be further formed between the first well 121P and the third heavily doping region 135N. The field oxide layer 160 may be further formed between the gate oxide layer 170 and the gate layer 140 and adjacent to the junction between the first well 121P and the third well 125N.

In the embodiment, the step of forming the field oxide layer 160 can be replaced by forming a shallow trench isolation (STI).

In one embodiment, as shown in FIGS. 3 and 4A-4B, the second well 223N, comprising the first region 223N-1 and the second region 223N-2 separated from each other, may be further formed.

In one embodiment, as shown in FIGS. 5A-5B, the fifth heavily doping region 139P may be further formed in the third heavily doping region 135N and located between the first region 233N-1 and the second region 223N-2. The fifth heavily doping region 139P has the second type doping.

In one embodiment, as shown in FIGS. 6A-6B, the lightly doping region 180N may be further formed between the first well 121P and the fourth heavily doping region 137N. The first lightly doping region 180N has the first type doping.

In one embodiment, as shown in FIG. 7, the second well 323N may be further formed on the substrate 110P. The third heavily doping region 135N is disposed in the second well 323N. The second well 323N has the first type doping.

In the embodiment, the first well 121P and the second well 323N are formed by such as a twin well process without adding additional masks or steps. Such process may include an epi process, a single poly process, and/or a could poly process.

In one embodiment, as shown in FIG. 8, the gate oxide layer 270 may be further formed. The manufacturing method of the gate oxide layer 270 includes such as the following steps. The first gate oxide segment 271 is formed between the gate layer 140 and the first well 121P, and the second gate oxide segment 273 is formed between the first gate oxide segment 271 and the field oxide layer 160. The thickness T1 of the first gate oxide segment 271 is smaller than the thickness T2 of the second gate oxide segment 273.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor element, comprising:
   a substrate;
   a first well disposed on the substrate;
   a first heavily doping region disposed in the first well;
   at least a second heavily doping region disposed in the first heavily doping region;
   a gate layer disposed on the first well;
   a third heavily doping region disposed on the substrate;
   a fourth heavily doping region disposed in the first well;
   a second well disposed in the third heavily doping region extending toward the substrate, wherein the second well has the first type doping; and
   a third well disposed between the substrate and the third heavily doping region, wherein the third well has the first type doping, and the second well is extending into the third well;
   wherein the first heavily doping region, the third heavily doping region, and the fourth heavily doping regions having a first type doping are separated from one another, and the first well and the second heavily doping region have a second type doping complementary to the first type doping.

2. The semiconductor element according to claim 1, further comprising a plurality of contacts electrically connecting the first heavily doping region and the second heavily doping region to a source terminal.

3. The semiconductor element according to claim 1, wherein the second well comprise a first region and a second region separated from each other.

4. The semiconductor element according to claim 3, further comprising a fifth heavily doping region disposed in the third heavily doping region and between the first region and the second region, wherein the fifth heavily doping region has the second type doping.

5. The semiconductor element according to claim 1, further comprising a first lightly doing region disposed between the first well and the fourth heavily doping region, wherein the first lightly doping region has the first type doping.

6. The semiconductor element according to claim 1, further comprising:
   a field oxide layer disposed between the first well and the third heavily doping region; and
   a gate oxide layer, comprising:
   a first gate oxide segment disposed between the gate layer and the first well; and
   a second gate oxide segment disposed between the first gate oxide segment and the field oxide layer;
   wherein a thickness of the first gate oxide segment is smaller than a thickness of the second gate oxide segment.

7. A manufacturing method of a semiconductor element, comprising:
   providing a substrate;
   forming a first well on the substrate;
   forming a first heavily doping region in the first well;
   forming at least a second heavily doping region in the first heavily doping region;
   forming a gate layer on the first well;
   forming a third heavily doping region on the substrate;
   forming a fourth heavily doping region in the first well;
   forming a second well in the third heavily doping region extending to the substrate, wherein the second well has the first type doping; and
   forming a third well between the substrate and the third heavily doping region, wherein the third well has the first type doping, and the second well is extending into the third well;
   wherein the first heavily doping region, the third heavily doping region, and the fourth heavily doping regions having a first type doping are separated from one another, and the first well and the second heavily doping region have a second type doping complementary to the first type doping.

8. The manufacturing method of the semiconductor element according to claim 7, further comprising:
   forming a plurality of contacts for electrically connecting the first heavily doping region and the second heavily doping region to a source terminal.

9. The manufacturing method of the semiconductor element according to claim 7, wherein the second well comprises a first region and a second region separated from each other.

10. The manufacturing method of the semiconductor element according to claim 9, further comprising:
    forming at least a fifth heavily doping region in the third heavily doping region and between the first region and the second region, wherein the fifth region has the second type doping.

11. The manufacturing method of the semiconductor element according to claim 7, further comprising:
forming a first lightly doping region between the first well and the fourth heavily doping region, wherein the first lightly doping region has the first type doping.

12. The manufacturing method of the semiconductor element according to claim 7, further comprising:
forming a field oxide layer between the first well and the third heavily doping region; and
forming a gate oxide layer, comprising:
forming a first gate oxide segment between the gate layer and the first well; and
forming a second gate oxide segment between the first gate oxide segment and the field oxide layer;
wherein a thickness of the first gate oxide segment is smaller than a thickness of the second gate oxide segment.

* * * * *